(12) United States Patent
Karklin et al.

(10) Patent No.: US 7,759,951 B2
(45) Date of Patent: Jul. 20, 2010

(54) SEMICONDUCTOR TESTING DEVICE WITH ELASTOMER INTERPOSER

(75) Inventors: Ken Karklin, Pasadena, CA (US); Raffi Garaedian, Monrovia, CA (US)

(73) Assignee: Touchdown Technologies, Inc., Baldwin Park, CA (US)

( * ) Notice: Subject to any disclaimer, the term of this patent is extended or adjusted under 35 U.S.C. 154(b) by 0 days.

(21) Appl. No.: 11/754,818

(22) Filed: May 29, 2007

(65) Prior Publication Data

US 2008/0297182 A1   Dec. 4, 2008

(51) Int. Cl.
*G01R 31/02* (2006.01)
(52) U.S. Cl. .................................................. 324/754
(58) Field of Classification Search ......... 324/752–762; 257/48; 29/592.1, 593, 830–831, 874
See application file for complete search history.

(56) References Cited

U.S. PATENT DOCUMENTS

| | | | |
|---|---|---|---|
| 3,806,801 A | 4/1974 | Bove | |
| 5,338,223 A * | 8/1994 | Melatti et al. | 439/482 |
| 5,410,258 A | 4/1995 | Bower et al. | |
| 5,437,556 A | 8/1995 | Bargain et al. | |
| 5,534,784 A | 7/1996 | Lum et al. | |
| 5,635,846 A | 6/1997 | Beaman et al. | |
| 5,800,184 A | 9/1998 | Lopergolo et al. | |
| 5,828,226 A | 10/1998 | Higgins et al. | |
| 5,886,535 A * | 3/1999 | Budnaitis | 324/760 |
| 6,297,652 B1 * | 10/2001 | Shimoda et al. | 324/754 |
| 6,300,782 B1 * | 10/2001 | Hembree et al. | 324/760 |
| 6,509,751 B1 | 1/2003 | Mathieu et al. | |
| 6,624,648 B2 | 9/2003 | Eldridge et al. | |
| 6,720,787 B2 * | 4/2004 | Kimura et al. | 324/765 |
| 6,729,019 B2 * | 5/2004 | Grube et al. | 29/830 |
| 6,859,054 B1 * | 2/2005 | Zhou et al. | 324/754 |
| 6,988,310 B2 * | 1/2006 | Advocate et al. | 29/825 |
| 7,268,568 B2 * | 9/2007 | Machida et al. | 324/754 |
| 2003/0095388 A1 | 5/2003 | Jiao et al. | |
| 2007/0057685 A1 | 3/2007 | Garabedian et al. | |

OTHER PUBLICATIONS

International Search Report for PCT/US07/69896 Dated Feb. 7, 2008.

* cited by examiner

*Primary Examiner*—Ha Tran T Nguyen
*Assistant Examiner*—Joshua Benitez
(74) *Attorney, Agent, or Firm*—Manuel F. de la Cerra

(57) ABSTRACT

A novel device for testing semiconductor chips is disclosed. A benefit with all the embodiments described herein is that the device may experience zero (or near zero) nascent force. The device may be comprised of a printed circuit board (PCB) that has at least one PCB piercing structure, a probe contactor substrate that has at least one substrate piercing structure, wherein the substrate piercing structure is electrically connected to a probe contactor, and an interposer that has at least one electrical via made of a conductive elastomer. When the PCB piercing structure and the substrate piercing structure pierce the elastomer, the PCB becomes electrically connected to the probe contactor. Instead of the piercing structure, the PCB or the probe contractor substrate may be adhered to the elastomer by an adhesive, such that the PCB becomes electrically connected to the probe contactor. The PCB piercing structure and the substrate piercing structure may include a flying lead wire, soldered pins or pressed pins. The adhesives may include, but are not limited to, screenable conductive surface mount adhesives. Finally, a diagnostic computer may be electrically connected to the PCB to assist in testing the semiconductor chips.

4 Claims, 12 Drawing Sheets

Planarity Error

SEMICONDUCTOR TESTING DEVICE WITH ELASTOMER INTERPOSER

1. FIELD OF THE INVENTION

The present invention relates to devices for testing semiconductor wafers and more particularly to a novel structure for a probe card interposer.

2. BACKGROUND

Typically, semiconductor chips are tested to verify that they function appropriately and reliably. This is often done when the semiconductor chips are still in wafer form, that is, before they are diced from the wafer and packaged. This allows the simultaneous testing of many semiconductor chips at one time, creating considerable advantages in cost and process time compared to testing individual chips once they are packaged. If chips are found to be defective, they may be discarded when the chips are diced from the wafer, and only the reliable chips are packaged.

Generally, modern microfabricated (termed MEMS) probe card assemblies for testing semiconductors have at least three components: a printed circuit board (PCB), a substrate to which thousands of probe contactors are coupled (this substrate hereinafter will be referred to as the "probe contactor substrate"), and a connector (also referred to herein as an interposer). The interposer electrically interconnects the individual electrical contacts of the PCB to the corresponding electrical contacts on the probe contactor substrate which relay signals to the individual probe contactors. In most applications the PCB and the probe contactor substrate must be roughly parallel and in close proximity, and the required number of interconnects may be in the thousands or tens of thousands. The vertical space between the PCB and the probe contactor substrate is generally constrained to a few millimeters by the customary design of the probe card assembly and the associated semiconductor test equipment. Conventional means of electrically connecting the probe contactor substrate to the contact pads of the PCB include solder connection, elastomeric vertical interposers, and vertical spring interposers. However, these technologies have significant drawbacks.

In the early days of semiconductor technology, the electrical connection between the probe contactor substrate and the PCB was achieved by solder connection. Solder connection technology involves electrically connecting an interposer to the PCB by means of melting solder balls. For instance, U.S. Pat. No. 3,806,801, assigned to IBM, describes a vertical buckling beam probe card with an interposer situated between the probe contactor substrate and a PCB. The interposer is electrically connected to the PCB, terminal to terminal, by means of melting solder balls (see FIG. 5). Another example is seen in U.S. Pat. No. 5,534,784, assigned to Motorola, which describes another probe card assembly with an interposer that is solder reflow attached to a PCB by using an area array of solder balls. The opposite side of the interposer is contacted by buckling beam probes (see FIG. 6).

In both of these patents, an array of individual probe contactor springs is assembled to the interposer, either mechanically or by solder attachment, which use solder area array technology. However, this method has a number of significant disadvantages, particularly when applied to large area or high pin count probe cards. For instance, probe cards with substrate sizes larger than two square inches are difficult to solder attach effectively because both the area array interconnect yield and reliability become problematic. During solder reflow, the relative difference in thermal expansion coefficients between the probe contactor substrate and PCB can shear solder joints and/or cause mismatch-related distortion of the assembly. Also, the large number of interconnects required for probe cards makes the yield issues unacceptable. Furthermore, it is highly desirable that a probe card assembly can be disassembled for rework and repair. Such large scale area array solder joints can not be effectively disassembled or repaired.

An alternative to solder area array interposers is the general category of vertically compliant interposers. These interposers provide an array of vertical springs with a degree of vertical compliance, such that a vertical displacement of a contact or array of contacts results in some vertical reaction force.

An elastomeric vertical interposer is an example of one type of a vertically compliant interposer. Elastomeric vertical interposers use either an anisotropically conductive elastomer or conductive metal leads embedded into an elastomeric carrier to electrically interconnect the probe contactor substrate to the PCB. Examples of elastomeric vertical interposers are described in U.S. Pat. No. 5,635,846, assigned to IBM (see FIG. 7), and U.S. Pat. No. 5,828,226, assigned to Cerprobe Corporation (see FIG. 8).

Elastomeric vertical interposers have significant drawbacks as well. Elastomeric vertical interposers often create distortion of the probe contactor substrate due to the forces applied on the probe contactor substrate as a result of the vertical interposer itself. These forces are necessary to ensure that the probe contactor substrate maintains a reliable electrical contact to the PCB. Additionally, elastomers as a material group tend to exhibit compression-set effects (the elastomer permanently deforms over time with applied pressure) which can result in degradation of electrical contact over time. The compression-set effect is accelerated by exposure to elevated temperatures as is commonly encountered in semiconductor probe test environments where high temperature tests are carried out between 75° C. and 150° C. or above.

A second type of vertical compliant interposer is the vertical spring interposer. In a vertical spring interposer, springable contacting elements with contact points or surfaces at their extreme ends, extend above and below the interposer substrate and contact the corresponding contact pads on the PCB and the probe contactor substrate with a vertical force. Examples of such vertical spring interposers are described in U.S. U.S. Pat. No. 5,437,556, assigned to Framatome (see FIG. 9A), U.S. Pat. No. 5,800,184, assigned to IBM (see FIG. 9B), U.S. Pat. No. 6,624,648 assigned to FormFactor (see FIG. 10A) and U.S. Pat. No. 6,624,648 assigned to FormFactor (see FIG. 10B).

However, vertical spring interposers (and also elastomer type vertical interposers) have significant disadvantages. In order to achieve electrical contact between the PCB and the substrate with probe contactors, the interposer springs must be compressed vertically. The compressive force required for a typical spring interposer interconnect is in the range of 1 gf to 20 gf per electrical contact. The aggregate force from the multitude of vertical contacts in the interposer causes the probe contactor substrate to bow or tent since it can only be supported from the edges (or from the edges and a limited number of points in the central area) due to the required active area for placement of probe contactors on the substrate. The tenting effect causes a planarity error at the tips of the probe contactors located on the surface of the probe contactor substrate (see FIG. 11).

This planarity error resulting from vertical interposer compression forces requires that the probe contactor springs provide a larger compliant range to accommodate full contact between both the highest and the lowest contactor and the semiconductor wafer under test. The increase in compliant range of a spring, where such increase is roughly equal to the planarity error, requires that the spring be larger, with all other factors such as contact force and spring material being constant, and hence creates a deleterious effect on probe pitch. Furthermore, probe contactor scrub is often related to the degree of compression, so the central contactors in the tented substrate will have different scrub than the outer contactors which are compressed less. Consistent scrub across all contactors is a desirable characteristic, which is difficult to achieve with vertical compliant interposers.

A novel and innovative approach to interposers is U.S. patent application Ser. No. 11/226,568 (the '568 application) by Raffi Garabedian (a common inventor to the present application), Nim Tea and Salleh Ismail, which is assigned to Touchdown Technologies, Inc. the same assignee of the present application. The '568 application discloses a laterally compliant interposer as shown in FIGS. 12A and 12B. FIG. 12A illustrates a lateral interposer (1200) in an unengaged state, that is, the interposer substrate (1205) is not in a position wherein it can affect an electrical contact between the PCB (1210) and the probe contactor substrate (1215). Note that the interposer contactor (1220) does not make contact with the either the contact pad/bump (1225) on the probe contactor substrate (1215) or the contact pad/bump (1230) on the PCB (1210). In FIG. 12B, the interposer is engaged by shifting it in the direction of arrow 1235 such that the interposer contactor (1215) makes contact with both the pad/bumps of the PCB (1210) and the probe contactor substrate (1215) (see outlined region 1240). In the engaged position the PCB (1210) is in electrical connection with the probe contactor substrate (1215). The laterally compliant interposer is an improvement over the prior art because, inter alia, it relieves the stresses inherent in the vertical interposer, thus minimizing the planarity error and its attendant drawbacks. However, the interposer can introduce some lateral stress to the probe contactor substrate and the PCB, and the lateral interposer can be an intricate part to manufacture.

Thus a new design for an interposer is needed to overcome the deficiencies of the prior art.

3. SUMMARY OF THE INVENTION

A novel device for testing semiconductor chips is disclosed. In one embodiment the device comprises a printed circuit board (PCB) that has at least one PCB piercing structure, a probe contactor substrate that has at least one substrate piercing structure, wherein the substrate piercing structure is electrically connected to a probe contactor, and an interposer that has at least one electrical via made of a conductive elastomer. When the PCB piercing structure and the substrate piercing structure pierce the elastomer, the PCB becomes electrically connected to the probe contactor.

In another embodiment, the device comprises a PCB with at least one PCB bond pad, a probe contactor substrate with at least one substrate bond pad, wherein the substrate bond pad is electrically connected to a probe contactor, and an interposer with at least one electrical via made of a conductive elastomer. When the PCB and substrate bond pads are adhered to the elastomer by an adhesive, the PCB becomes electrically connected to the probe contactor.

In yet another embodiment, the device comprises a PCB with at least one PCB bond pad, a probe contactor substrate with at least one substrate piercing structure, wherein the substrate piercing structure is electrically connected to a probe contactor, and an interposer comprising at least one electrical via made of a conductive elastomer. When the PCB bond pad is adhered to the elastomer by an adhesive, and the substrate piercing structure pierces the elastomer, the PCB becomes electrically connected to the probe contactor.

In a fourth embodiment, the device comprising a PCB with at least one PCB piercing structure, a probe contactor substrate with at least one substrate bond pad, wherein the substrate bond pad is electrically connected to a probe contactor, and an interposer comprising at least one electrical via made of a conductive elastomer. When the substrate bond pad is adhered to the elastomer by an adhesive, and the PCB piercing structure pierces the elastomer, the PCB becomes electrically connected to the probe contactor.

A benefit with all these embodiments is that the device may experience zero (or near zero) nascent force—i.e., the force required to maintain a reliable connection between the PCB and probe contactor substrate. In refinements to the above embodiments, the PCB piercing structure and the substrate piercing structure can be selected from a group consisting of: flying lead wire, soldered pins, pressed pins and combinations thereof. Also, several types of conductive adhesives may be used, including, but not limited to various types of screenable conductive surface mount adhesives such as CE3103 and CE3100 from Emerson Cummings and Ablebond 8175 from Ablestik Labs. Finally, a diagnostic computer may be electrically connected to the PCB.

4. BRIEF DESCRIPTION OF THE DRAWINGS

5. DETAILED DESCRIPTION

A novel device for testing semiconductor chips is disclosed. A benefit is that the device may experience zero (or near zero) nascent force, such that the device overcomes the deficiencies in the prior art. Also, because the device uses a conductive elastomer, the device allows for adjustments in the X, Y and Z directions.

Figure 1A:
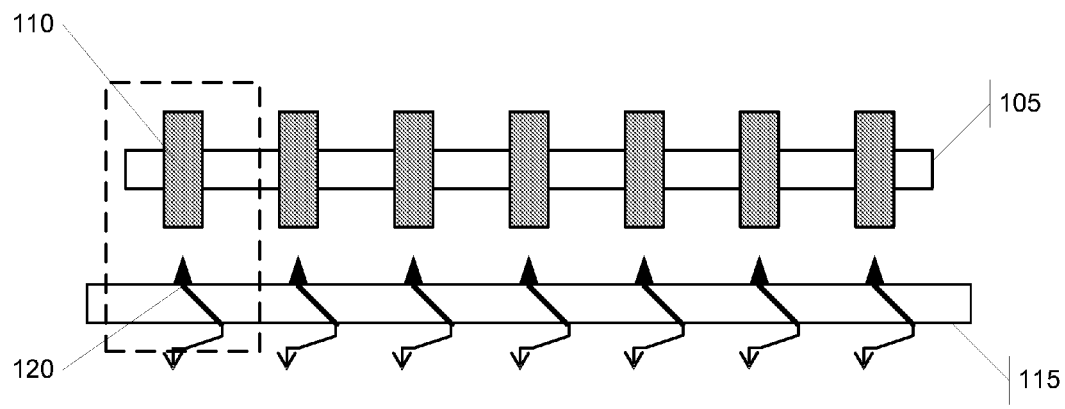
FIGS. 1A-1E illustrate a method and structure that employ piercing structures and conductive elastomers to form a novel interposer.

Referring to FIGS. 1A though 1E, the device is comprised of a printed circuit board (PCB) that has at least one PCB piercing structure, a probe contactor substrate that has at least one substrate piercing structure, wherein the substrate piercing structure is electrically connected to a probe contactor, and an interposer that has at least one electrical via made of a conductive elastomer. When the PCB piercing structure and the substrate piercing structure pierce the elastomer, the PCB becomes electrically connected to the probe contactor.

The conductive elastomer (110) is a conductive metal partially embedded in an elastomer by molding. Some examples include, Tyco Electronics Metallized Particle Interconnect, Paricon Pariposer®, Fujipoly, and Shin-Etsu Polymer anisotropic conductive sheet (MT-P type). Other types of conductive elastomers are available and would be apparent to one skilled in the art. Because of the deformable nature of the conductive elastomer, an added benefit is that the probe contactor substrate (115) can be precisely aligned in the X, Y and Z directions. This is unlike previous interposers which were either rigid or where such movement would compromise the complete electrical connectivity needed.

Now specifically referring to FIG. 1A, the interposer (105) contains at least one electrical via (110) made of a conductive elastomer. The probe contactor substrate (115) contains at least one substrate piercing structure (120). In practice it is likely that interposer (105) contains several electrical via (in FIG. 1A, seven such via are illustrated) and the probe contactor substrates (115) would also contain multiple substrate piercing structures (in FIG. 1A, seven such piercing structures are illustrated). The benefit of multiple electrical via is that ultimately the PCB (not shown in FIG. 1A) can make several separate electrical connections with several separate probe contactors.

Figures 1B, 1C:
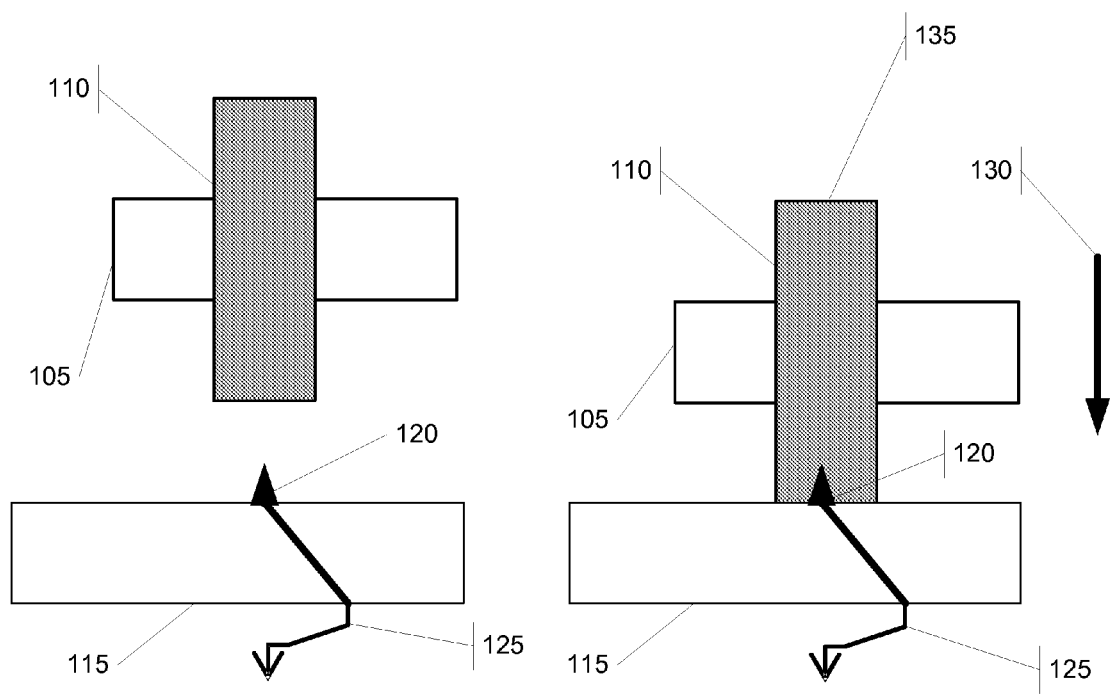

For simplicity, the dashed outline box in FIG. 1A represents a portion of the device that contains only one such electrical via, and this via is illustrated with reference to FIGS. 1B and 1C. The interposer (105) contains a conductive elastomer that forms a single electrical via (110). The probe contactor substrate (115) contains a substrate piercing structure (120) electrically connected to a probe contactor (125). In FIG. 1C, when the electrical via made of conductive elastomer (110) is brought down in the direction of arrow 130, it is pierced by the substrate piercing structure (120). In this configuration, a contact placed at position 135 would be in electrical contact with the probe contact (125)—through the electrical via made of conductive elastomer (110) and the substrate piercing structure (120).

Figure 1D:
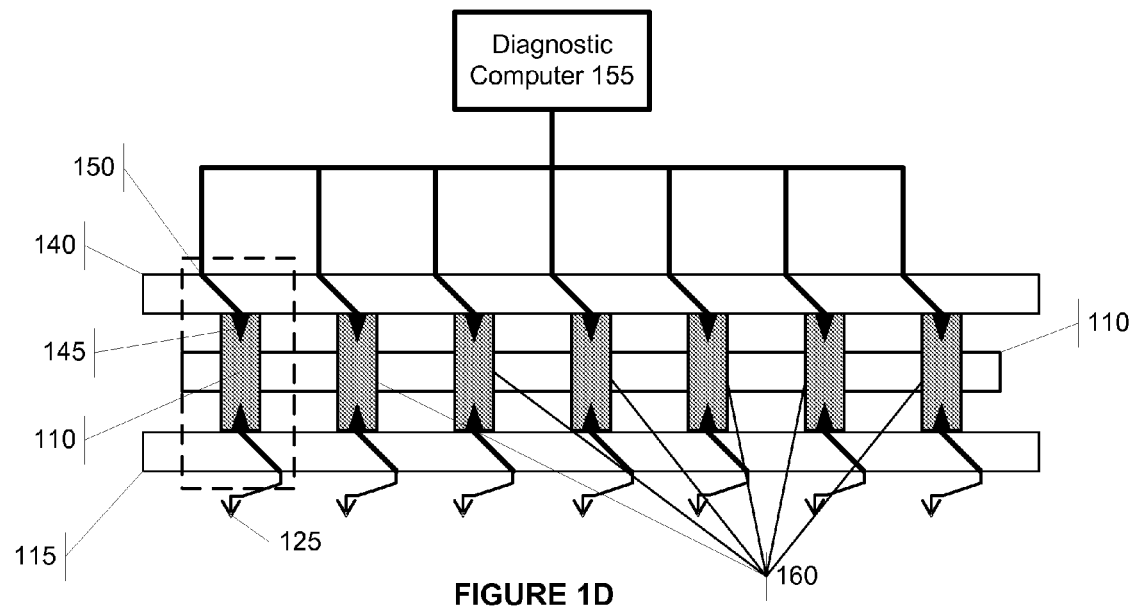

Referring to FIG. 1D, a PCB (140) is introduced and makes contact with the electrical via made of conductive elastomer (110) by means of a PCB piercing structure (145) in the same way as described with reference to FIGS. 1B and 1C. In this configuration, a contact made with the PCB (140) at position 150 would be in electrical contact with the probe contact (125)—through the PCB piercing structure (145), the electrical via made of conductive elastomer (110) and the substrate piercing structure (120). In practice, the PCB is connected to an external diagnostic computer (155) that assists in testing the semiconductor that is under inspection.

Figure 1E:
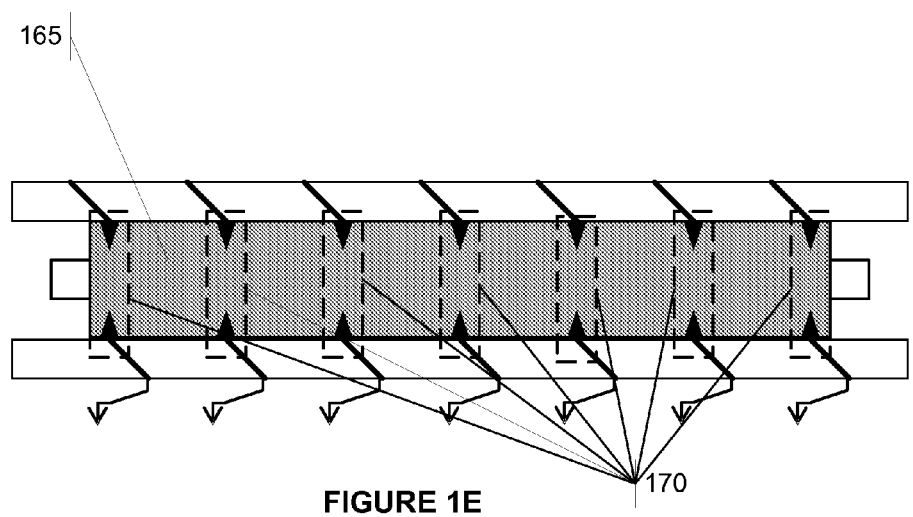

FIGS. 1A through 1D illustrate multiple electrical via such that the PCB (140), and consequently the diagnostic computer (155), can be in separate electrical contact with multiple probe contactors. The single electrical via made of conductive elastomer (110) is illustrated as seven separate conductive elastomer structures, i.e., parts 110 and 160. However, it is possible to use a single conductive elastomer structure that contains multiple separate electrical via. This configuration is shown in FIG. 1E which illustrates a single conductive elastomer structure (165) that allows for multiple electrical via (170). By way of non-limiting examples, some conductive elastomers use highly organized conductive columns of spherical particles supported in an elastomeric matrix; thus a single piece of conductive elastomer can support multiple electrical via in the direction of the columns of conductive electrical spheres. Other conductive elastomers embed fine wires vertically in an elastomer. Again allowing a single piece of conductive elastomer to support multiple electrical via in the direction of the fine wires.

One benefit to using piercing structures in a conductive elastomer is that the PCB and the probe contactor substrate can be separated from the interposer after they have been joined, if a repair or rework becomes necessary. After the repair or rework is completed, the PCB can once again pierce the interposer, as can the probe contactor substrate. This flexibility increases efficiency yield. For example, should the PCB used on one device become irreversibly damaged (while the probe card substrate to which it is connected remains operational) and the probe contactor substrate on another becomes irreversibly damaged (while the PCB to which it is connected remains operational), then the operational PCB and the operational probe card substrate can be separated from their respective interposers and rejoined to each other using an interposer. This results in a device that is operational, despite previously having two damaged devices.

Figure 2A:
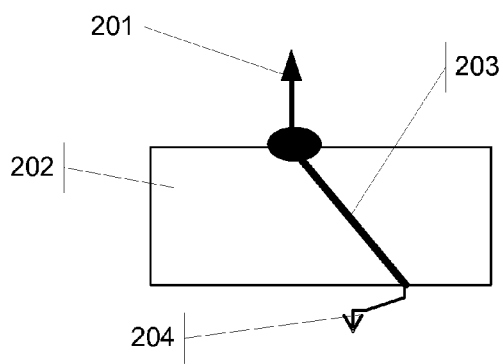
FIG. 2A illustrates a type of substrate piercing structure.
Figure 2B:
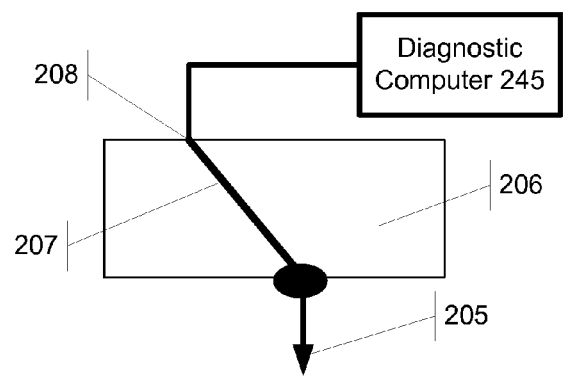
FIG. 2B illustrates a type of PCB piercing structure.

FIG. 2A illustrates the substrate piercing structure (201) affixed to the probe contactor substrate (202). The substrate piercing structure (201) is electrically connected (through electrical conduit 203) to the probe contactor (204). FIG. 2B illustrates the PCB piercing structure (205) affixed to the PCB substrate (206). The PCB piercing structure (205) is electrically connected (through electrical conduit 207) to position 208, which may further be connected to a diagnostic computer (245). Some non-limiting examples of piercing structure (either the PCB or the substrate, 205 and 201 respectively) may include pins soldered to the substrate, pins pressed into the substrate or by stud bump bonding (SBB) (described in more detail below with reference to FIGS. 2C-2F).

Figure 2C:
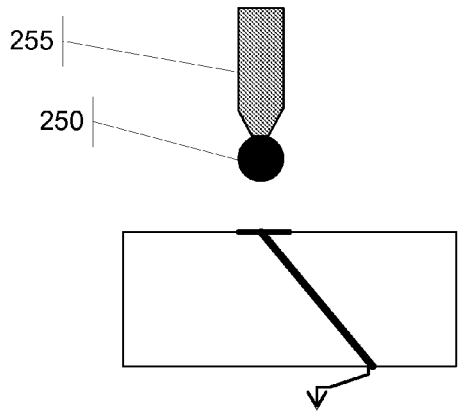
FIGS. 2C-2F show a stud bump bonding (SBB) method to form the piercing structure.
Figure 2D:
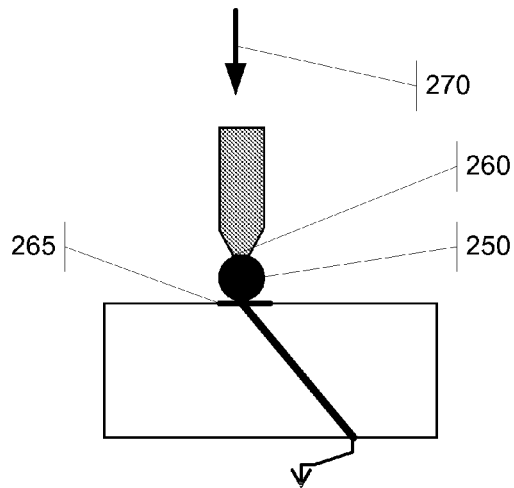
Figure 2E:
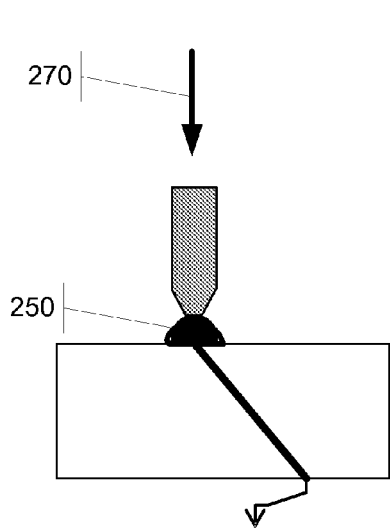
Figure 2F:
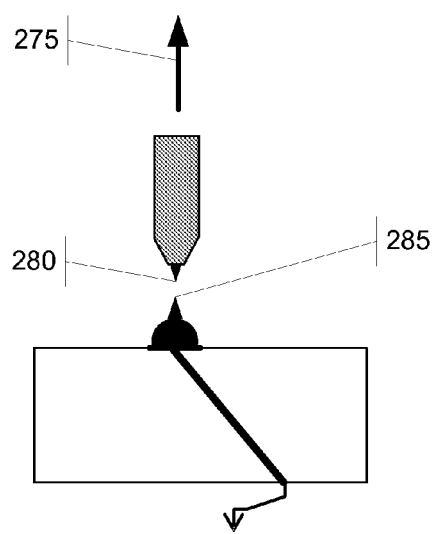

One method to form the piercing structure is SBB. Referring to FIG. 2C, the tip of the bond wire (generally gold) is melted to form a ball (250) at the end of a wire bonding assembly (255). In FIG. 2D, the tip of this assembly (260) is brought close to the bond pad (265) in the direction of arrow 270 such that the ball (250) is in contact with the bond pad (265). Applying mechanical force in the direction of arrow 270 deforms the ball (250) for more surface area contact with the bond bad (265), and by adding heat and ultrasonic energy, the ball (250) creates a metallic connection to the bond pad (265) as shown in FIG. 2D. The wire bonding assembly (255) finishes by moving in the direction of arrow 275 and breaking off the bond wire (280) from the ball (250) to begin another cycle as shown in FIG. 2E. Often this break creates a sharp structure (285) that may be used as piercing structure. Alternatively, or in addition, the structure (285) may be sharpened by techniques commonly known to those of skill in the art. Current wire bonding assemblies can make more than 12 of these structures per second, with improvement made constantly.

Figure 3A:
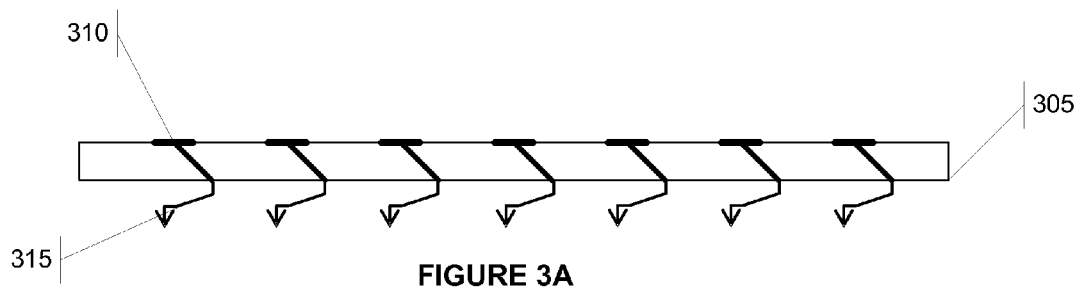
FIGS. 3A-3G illustrate a method and structure that employ adhesives and conductive elastomers to form a novel interposer.

In another embodiment, instead of using piercing structures to make an electrical contact with the conductive elastomer, an adhesive is used. Referring to FIGS. 3A though 3H, the device is comprised of a PCB with at least one PCB bond pad, a probe contactor substrate with at least one substrate bond pad, wherein the substrate bond pad is electrically connected to a probe contactor, and an interposer with at least one electrical via made of a conductive elastomer. When the PCB and substrate bond pads are adhered to the elastomer by an adhesive, the PCB becomes electrically connected to the probe contactor.

Figure 3B:
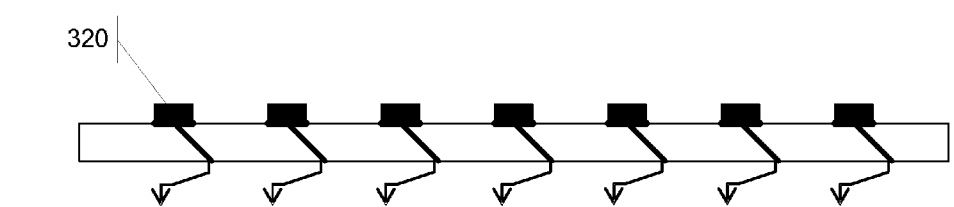

Now, specifically referring to FIG. 3A, probe contactor substrate 305 contains at least one substrate bond pad (310) that is electrically connected to a probe contactor (315). In FIG. 3B, an adhesive (320) is applied to the substrate bond pad (310). This may be applied by any suitable means including screening and dispensing. It would be apparent to one skilled in the art that several types of conductive adhesives may be used, including but not limited to, screenable conductive surface mount adhesives such as CE3103 and CE3100 from Emerson Cummings and Ablebond 8175 from Ablestik Labs.

Figure 3C:
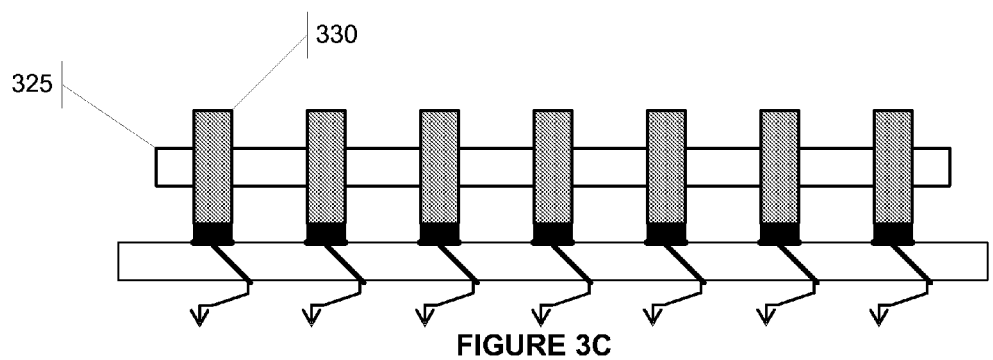

Once the adhesive (320) has been applied to the substrate bond pad (310), an interposer (325) that contains at least one electrical via (330) made of a conductive elastomer is brought into contact with the substrate bond pad (310) as shown in FIG. 3C. It would be apparent to one skilled in the art that the adhesive may be applied to the conductive elastomer surface instead of the substrate bond pad (310) and the interposer could then be brought into contact with the substrate bond pad (310). Alternatively, the adhesive may be applied to both the conductive elastomer surface and the substrate bond pad (310).

Figure 3D:
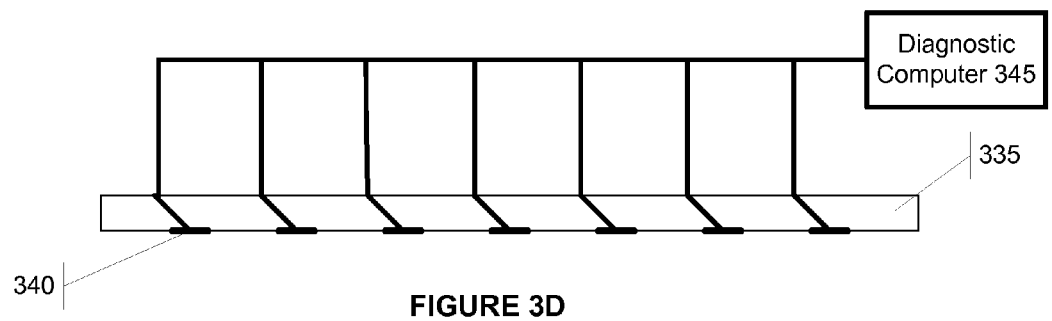
Figure 3E:
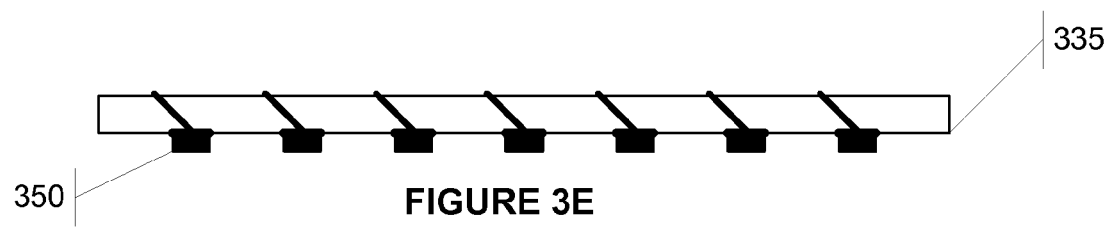

In FIG. 3D, the PCB (335) contains at least one PCB bond pad (340). The PCB bond pad (340) may be in electrical connection with a diagnostic computer (345). In FIG. 3E, an adhesive (350) is applied to the PCB bond pad (340). This may be applied by any suitable means including screening and dispensing. It would be apparent to one skilled in the art that several types of conductive adhesives may be used, including but not limited to, screenable conductive surface mount adhesives such as CE3103 and CE3100 from Emerson Cummings and Ablebond 8175 from Ablestik Labs.

Figure 3F:
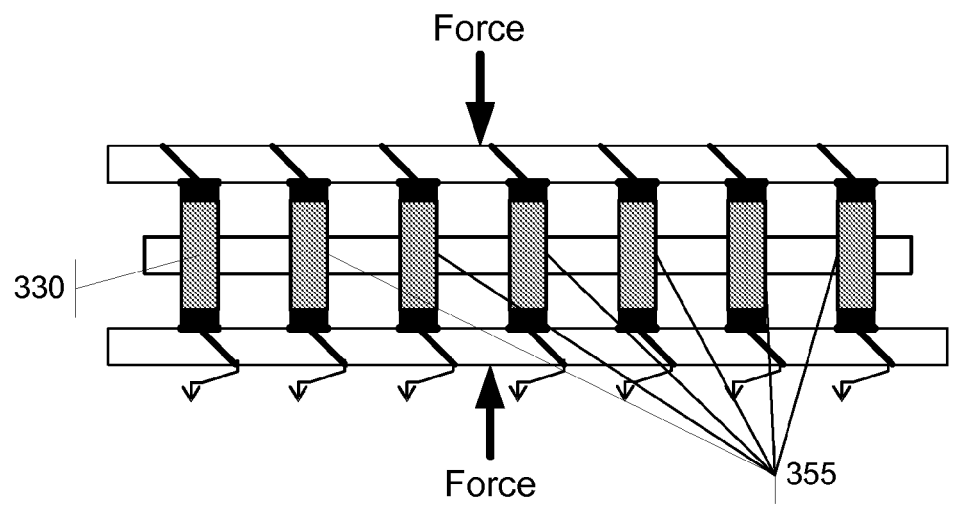

Once the adhesive (350) has been applied to the PCB bond pad (340), the interposer (325) that contains at least one electrical via (330) made of a conductive elastomer is brought into contact with the PCB bond pad (340) as shown in FIG. 3F. Force is applied to sandwich the interposer (325) between the PCB and the probe contactor substrate so that the adhesive (both parts 350 and 320) can set and ensure a reliable electrical connection. It would be apparent to one skilled in the art that the adhesive may be applied to the conductive elastomer surface instead of the PCB bond pad (340), and the interposer could then be brought into contact with the PCB bond pad (340). Alternatively, the adhesive may be applied to both the conductive elastomer surface and the PCB bond pad (340).

While the embodiment just described makes reference to a single electrical via, in practice it is likely that interposer (325) contains several electrical via (in FIGS. 3A-3H, seven such via are illustrated) and the probe contactor substrate (305) would also contain multiple bond pads (in FIGS. 3A-3H, seven such pads are illustrated). The benefit of multiple electrical via is that ultimately the PCB can make several separate electrical connections with several separate probe contactors.

Figure 3G:
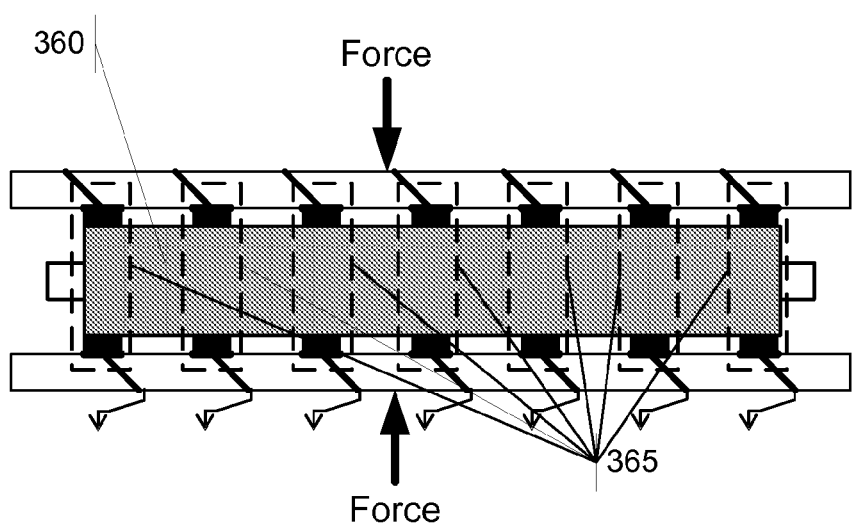

Also, in the embodiment shown in FIGS. 3A through 3F, the single electrical via made of conductive elastomer (330) is illustrated as seven separate conductive elastomer structures i.e., parts 330 and 355 in FIG. 3F. However, it is possible to use a single conductive elastomer structure that contains multiple separate electrical via. This configuration is shown in FIG. 3G which illustrates a single conductive elastomer structure (360) that allows for multiple electrical via (365).

Figure 4A:
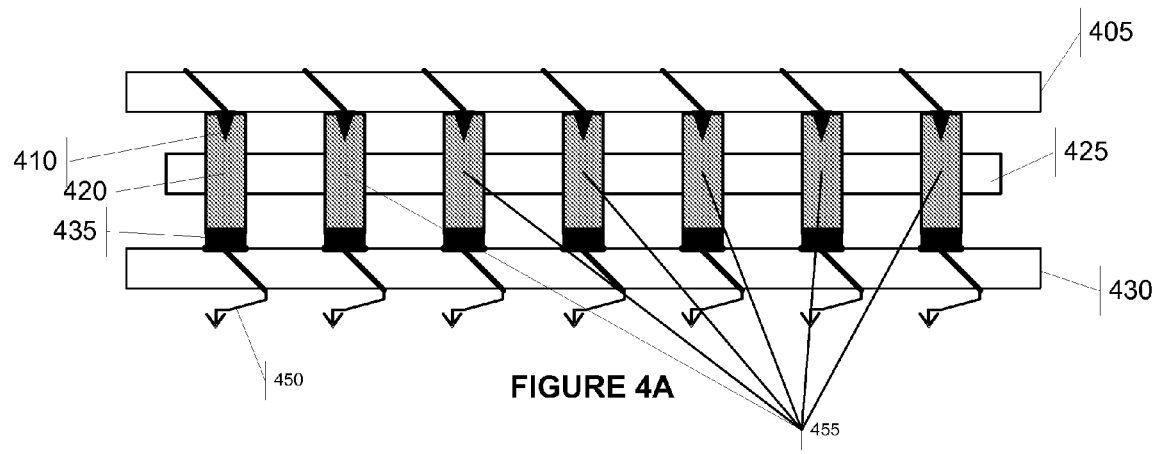
FIGS. 4A-4F show a method and structure that employ adhesives, piercing structures and conductive elastomers to form a novel interposer.
Figure 4B:
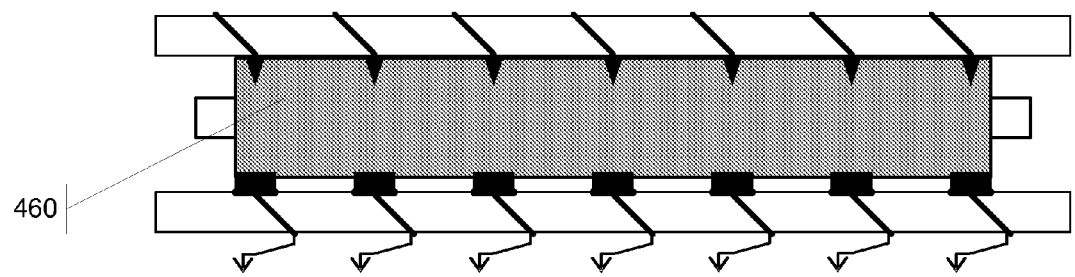

In yet another embodiment, the both piercing structures and adhesives may be used to achieve an electrical connection with a conductive elastomer. Referring to FIG. 4A, the PCB (405) contains PCB piercing structures (410) that pierce the conductive elastomer (420) of the interposer (425). Between the conductive elastomer (420) and the probe card substrate (430) is an adhesive (435) that joins the conductive elastomer (420) to the substrate bond pad (440). In this configuration, a contact made with the PCB (405) at position 445 would be in electrical contact with the probe contactor (450)—through the PCB piercing structure (410), the conductive elastomer (420), the adhesive (435), the substrate bond pad (440). In practice, the PCB is connected to an external diagnostic computer that assists in testing the semiconductor that is under inspection. Instead of several conductive elastomer structures as shown in FIG. 4A (i.e., structures 420 and 455), a single elastomer structure (460) may be use as shown in 4B.

Figure 4C:
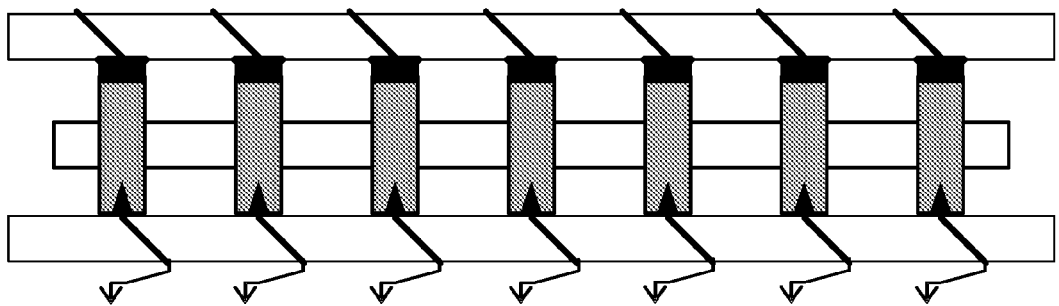
Figure 4D:
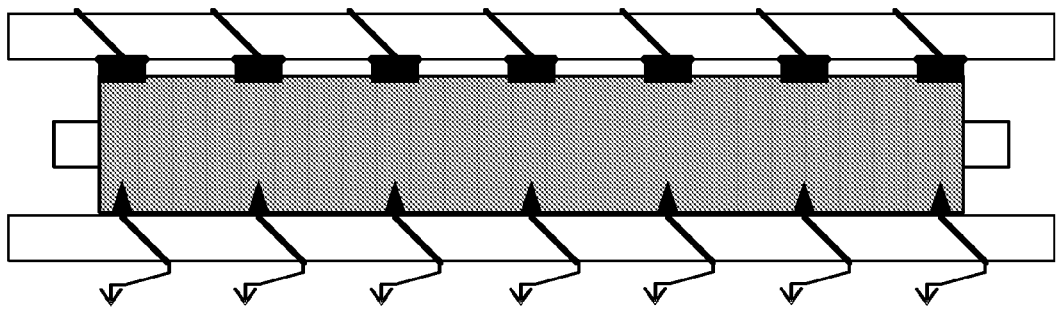
Figure 4E:
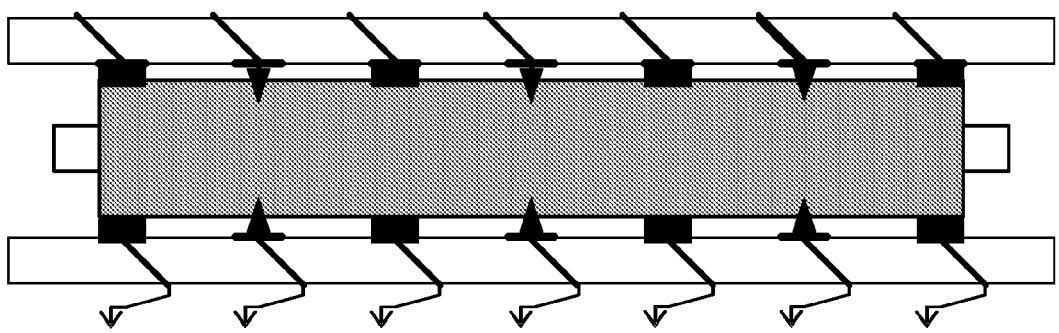
Figure 4F:
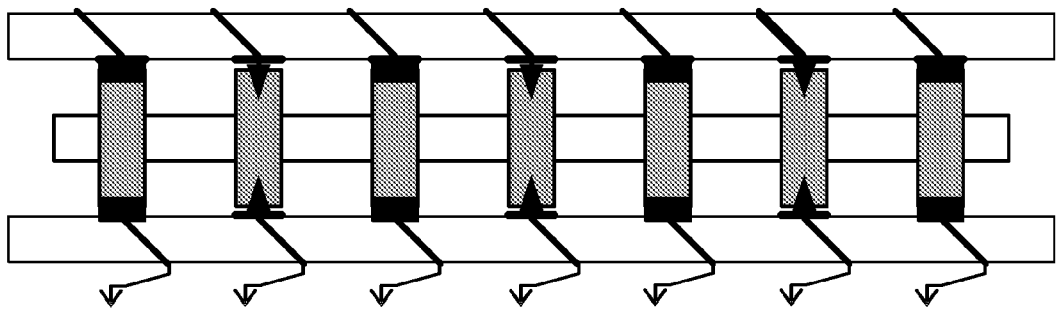
Figure 5:
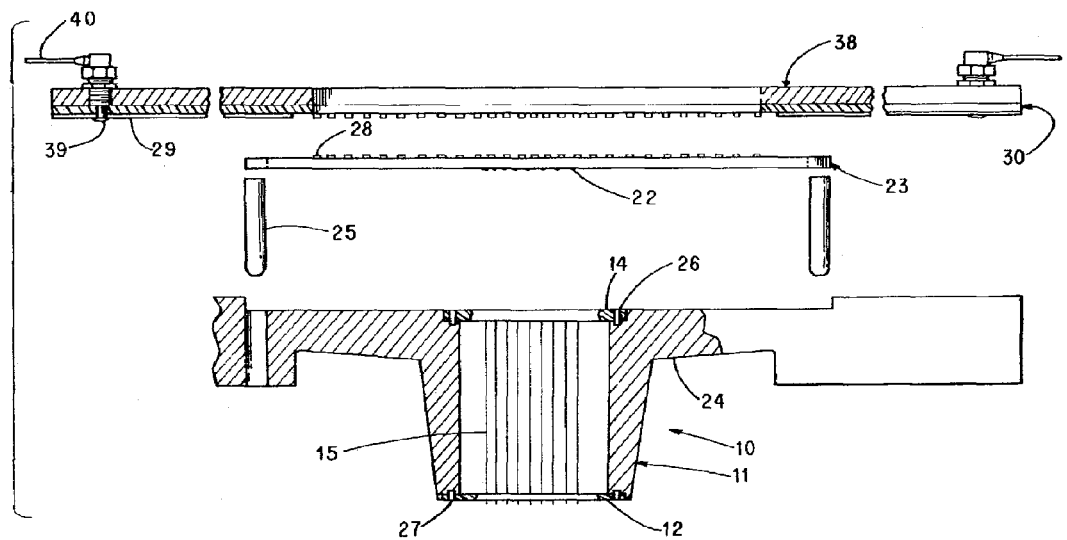
FIG. 5 is an illustration of a prior art interposer that employs melted solder balls.
Figure 6:
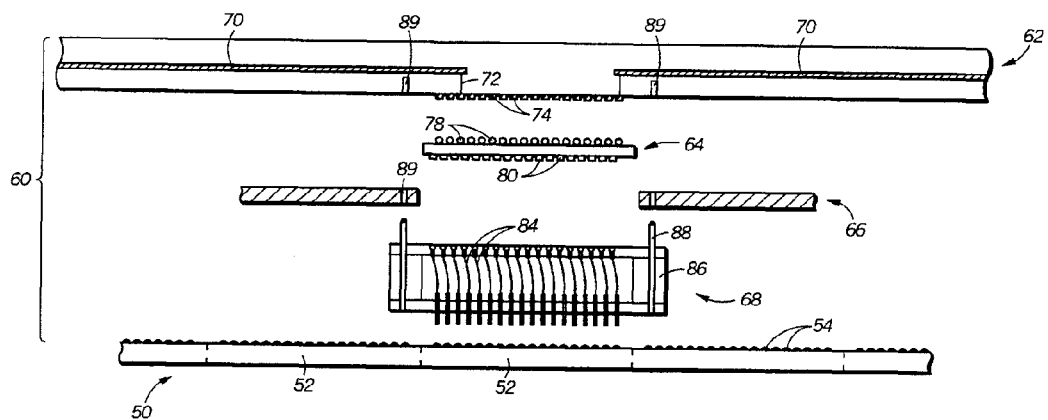
FIG. 6 is an illustration of a prior art interposer that employs an area array of solder balls.
Figure 7:
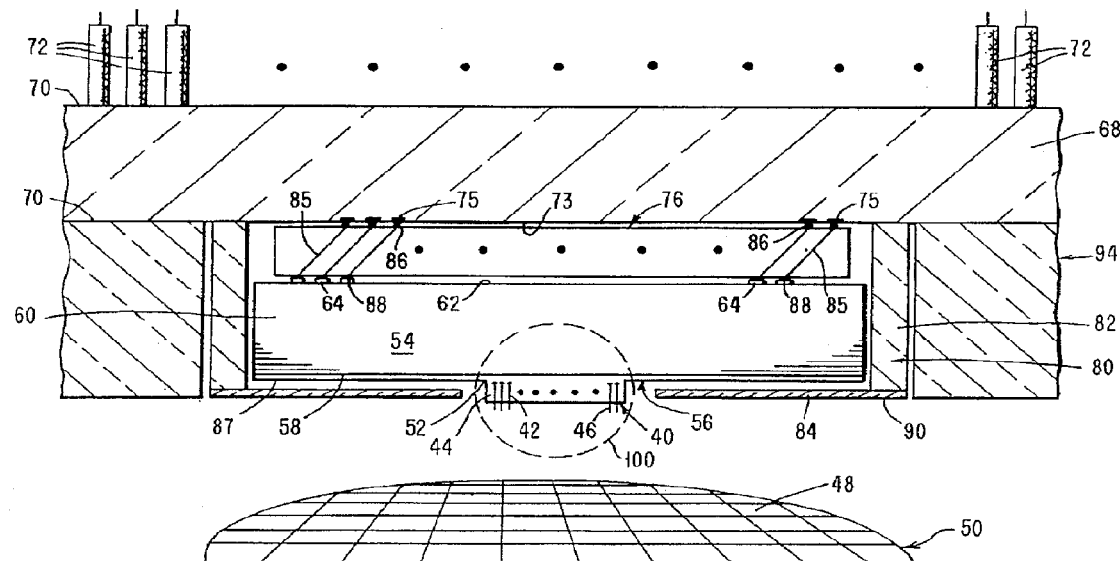
FIG. 7 is an illustration of a prior art interposer that employs elastomeric vertical interposers.
Figure 8:
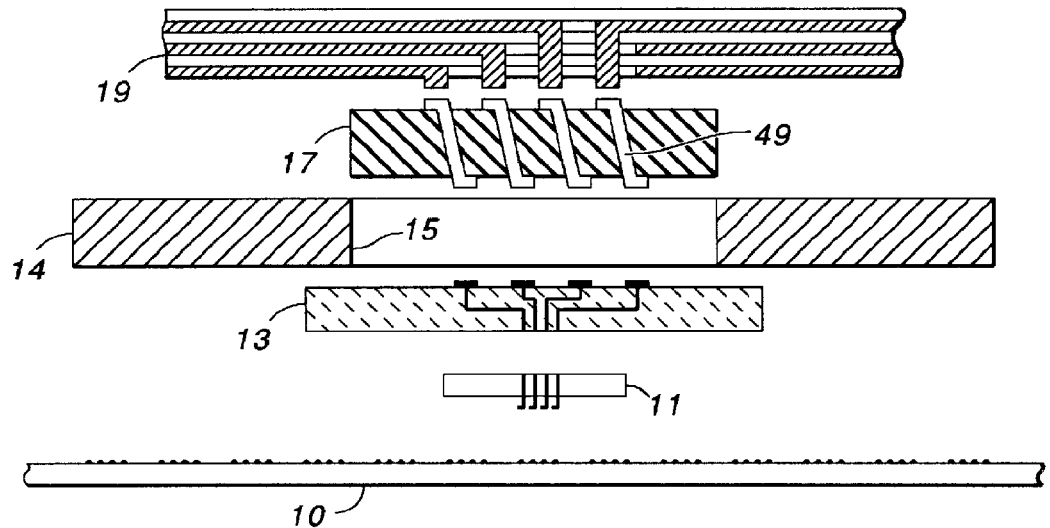
FIG. 8 is an illustration of a prior art interposer that employs elastomeric vertical interposers.
Figure 9A:
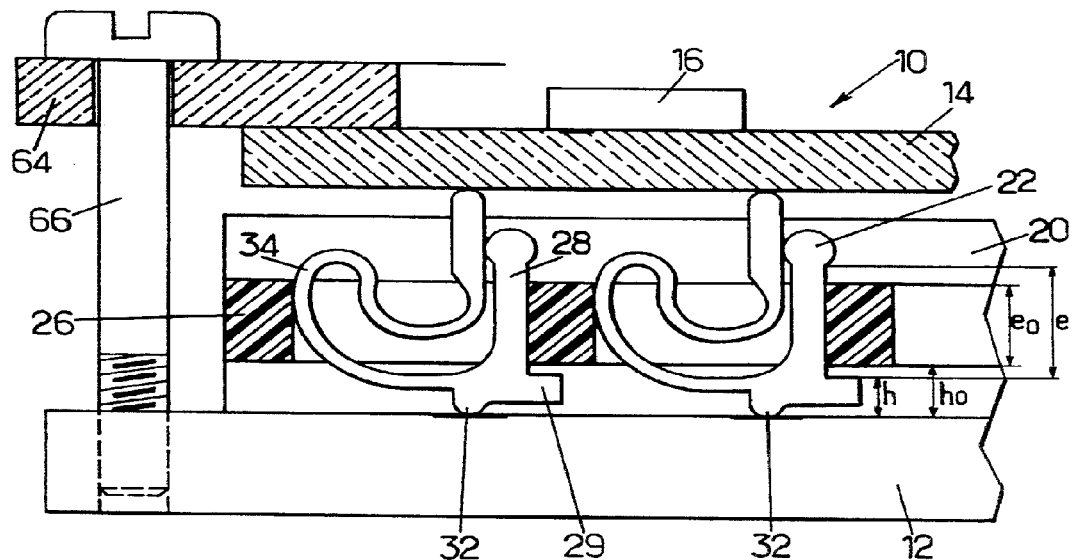
FIGS. 9A and 9B are illustrations of a prior art interposers that employs vertical spring interposers.
Figure 9B:
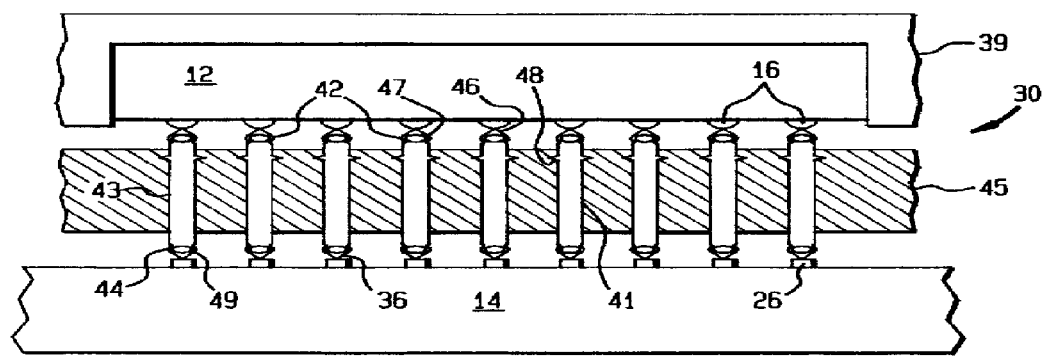
Figure 10A:
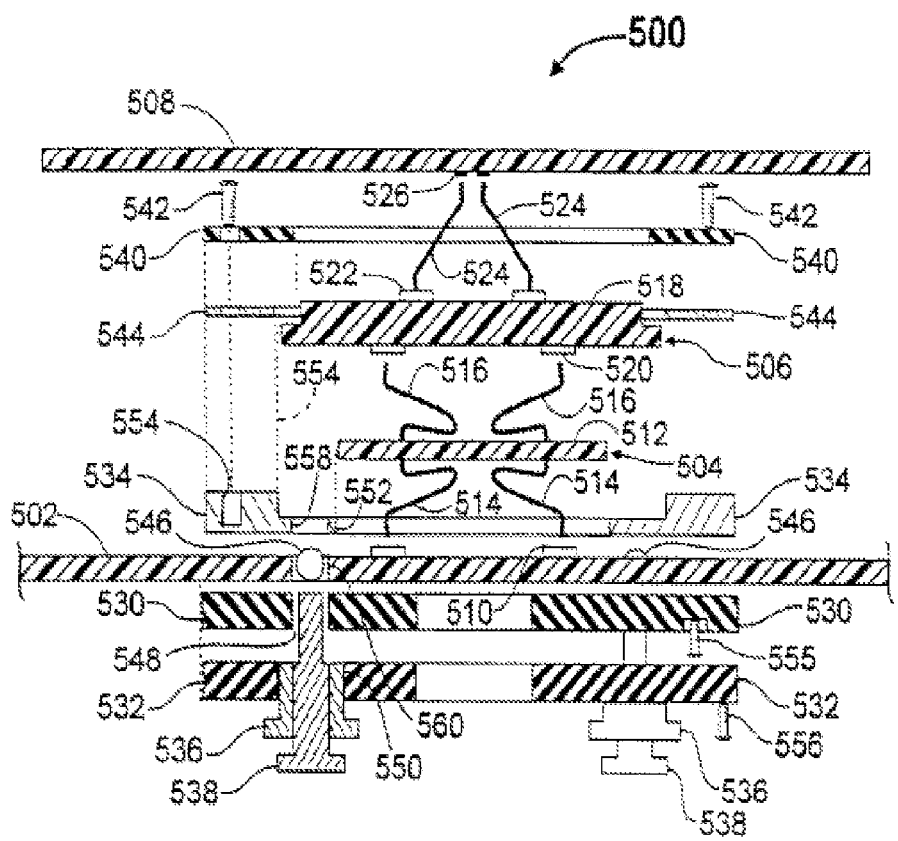
FIGS. 10A and 10B are illustrations of a prior art interposer that employs vertical spring interposers.
Figure 10B:
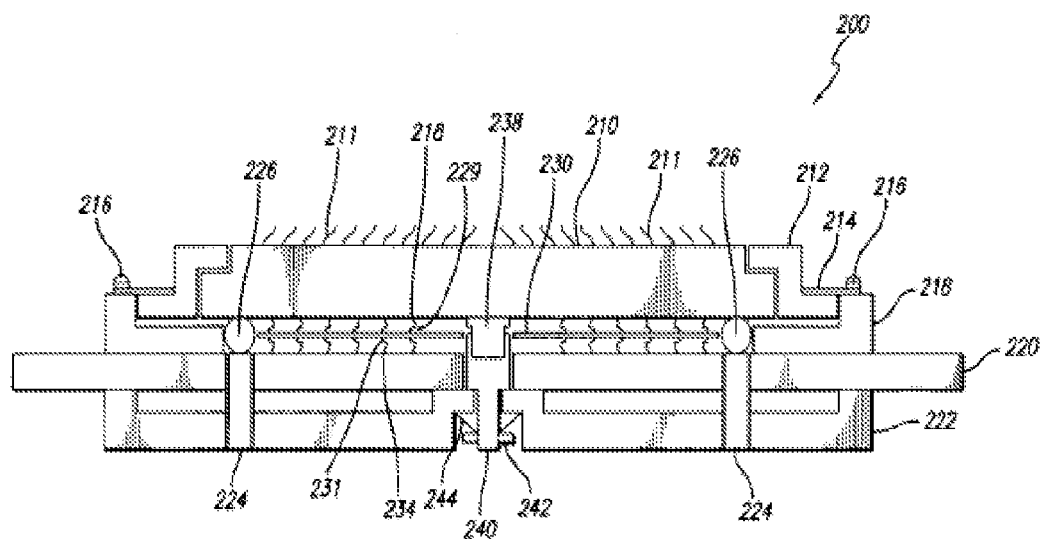
Figure 11:
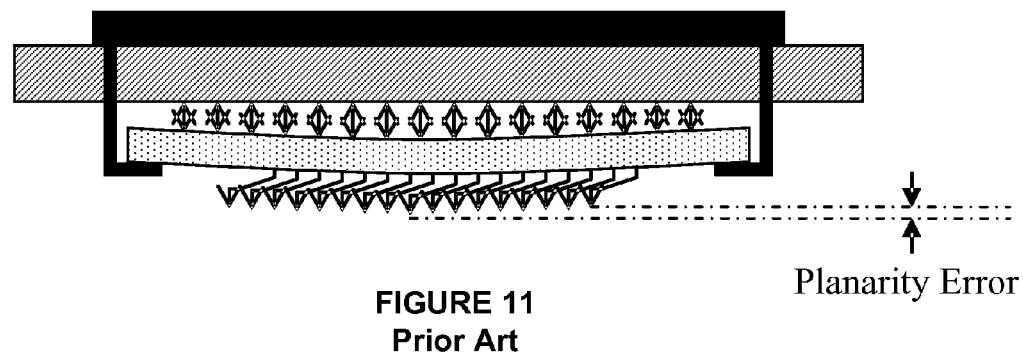
FIG. 11 is an illustration of a planarity error associated with prior art interposers.
Figure 12A:
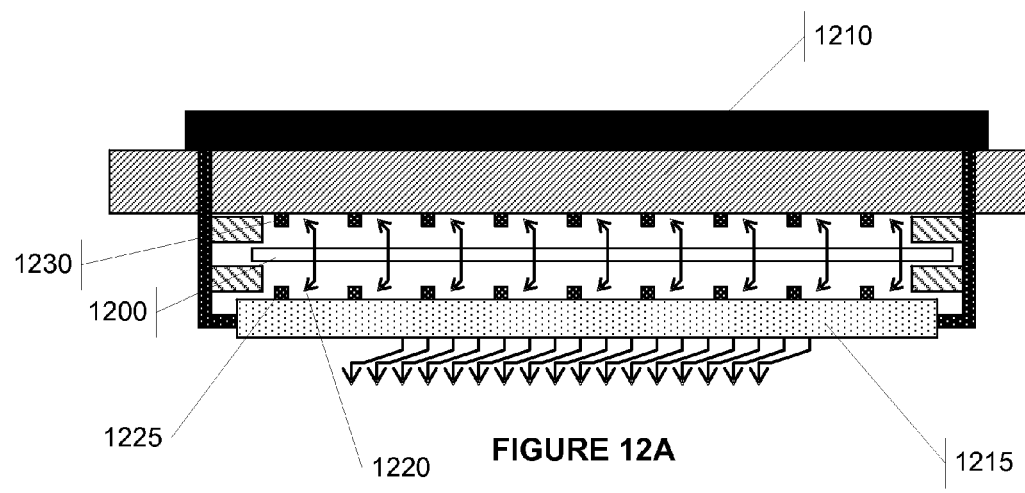
FIGS. 12A and 12B is an illustration of a laterally compliant interposers disclosed in U.S. patent application Ser. No. 11/226,568 by Raffi Garabedian (a common inventor to the present application), Nim Tea and Salleh Ismail, which is assigned to Touchdown Technologies, Inc. the same assignee of the present application.
Figure 12B:
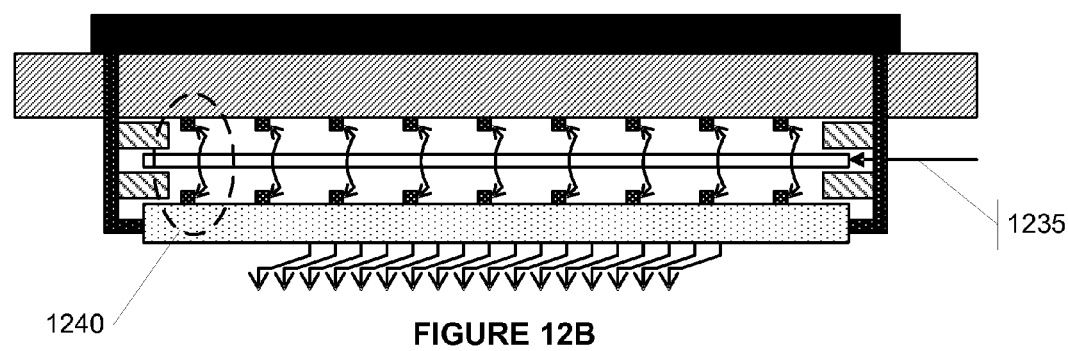

In FIG. 4C, both piercing structures and adhesives may be used to achieve an electrical connection with a conductive elastomer. Here, the piercing structures are used on the probe card substrate, while adhesives are used with the PCB. Also, the interposer may have several conductive elastomer structures as in FIG. 4C, or a single elastomer structure as in FIG. 4D. As shown in FIGS. 4E and 4F, it would be apparent given this disclosure, that both piercing structures and adhesives can be used on the PCB to electrically bind it to the interposer; and it would be apparent that piercing structures and adhesives can be used on the probe contactor substrate to electrically bind it to the interposer.

Having described the methods and structures in detail and by reference to several preferred embodiments thereof, it will be apparent that modifications and variations are possible without departing from the scope of the invention defined in the following claims. Moreover, the applicants expressly do not intend that the following claims "and the embodiments in the specification to be strictly coextensive." *Phillips v. AHW Corp.*, 415 F.3d 1303, 1323 (Fed. Cir. 2005) (en banc).

The invention claimed is:

1. A device for testing semiconductor chips comprising:
   a printed circuit board (PCB) comprising at least one PCB piercing structure;
   a probe contactor substrate comprising at least one substrate piercing structure, wherein the substrate piercing structure is electrically connected to a probe contactor;
   an interposer comprising at least one electrical via comprising a conductive elastomer;
   wherein the PCB piercing structure and the substrate piercing structure pierce the elastomer such that the PCB becomes electrically connected to the probe contactor.

2. The device of claim 1 wherein the PCB piercing structure is selected from a group consisting of:
   flying lead wire, soldered pins, pressed pins and combinations thereof.

3. The device of claim 1 wherein the substrate piercing structure is selected from a group consisting of:
   flying lead wire, soldered pins, pressed pins and combinations thereof.

4. The device of claim 1, further comprising a diagnostic computer electrically connected to the PCB.

* * * * *